(12) United States Patent
Iwasaki

(10) Patent No.: US 6,200,845 B1
(45) Date of Patent: Mar. 13, 2001

(54) METHOD OF FORMING A STORAGE CAPACITOR

(75) Inventor: Haruo Iwasaki, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/553,172

(22) Filed: Apr. 20, 2000

(30) Foreign Application Priority Data

Apr. 23, 1999 (JP) .................................................. 11-116359

(51) Int. Cl.$^7$ .............................................. H01L 21/8242
(52) U.S. Cl. .......................................... 438/238; 438/254
(58) Field of Search ........................... 438/238, 253–256, 438/396–399

(56) References Cited

U.S. PATENT DOCUMENTS 5,597,755 * 1/1997 Ajika et al. .
5,795,805 * 8/1998 Wu et al. ............................ 438/253

* cited by examiner

Primary Examiner—Jey Tsai
(74) Attorney, Agent, or Firm—Young & Thompson

(57) ABSTRACT

The present invention provides a method of forming at least a bottom electrode of a capacitor in a semiconductor device. The method comprises the steps forming a first insulation film on a multilayer structure over a semiconductor substrate; forming at least a contact hole which penetrates through the first insulation film and the multilayer structure to reach a surface of the semiconductor substrate; selectively removing the first insulation film to form mask patterns on the multilayer structure; forming a single conductive film which extends within the at least contact hole and over the multilayer structure as well as cover the mask patterns; forming a second insulation film on the single conductive film; partially removing the second insulation film and the single conductive film over the mask patterns so that tops of the mask patterns are shown; and removing remaining parts of the second insulation film and the mask patterns to form at least a bottom electrode comprising a single conductive layer.

8 Claims, 23 Drawing Sheets

METHOD OF FORMING A STORAGE CAPACITOR

BACKGROUND OF THE INVENTION

The present invention relates to a method of forming a storage capacitor, and more particularly to a method of forming a storage capacitor used in a semiconductor memory device such as a dynamic random access memory.

In the semiconductor memory device such as the dynamic random access memory, staked capacitors are used to ensure a large capacity with realizing a high density integration of the semiconductor memory device. The following descriptions will focus on a conventional storage capacitor and a conventional method of forming the same.

FIG. 1 is a fragmentary cross sectional elevation view illustrative of a conventional storage capacitor provided in a semiconductor memory device. The semiconductor memory device is formed on a semiconductor substrate 101 such as a silicon substrate. Field oxide films 103 are selectively formed on a surface of the semiconductor substrate 101, so that the field oxide films 103 define active regions or device regions. Gate insulation films not illustrated are provided on the active regions or the device regions of the semiconductor substrate 101. Gate electrodes 102 are formed on the gate insulation films. A first inter-layer insulator 104 is provided which extends over the field oxide films 103 and the active regions or the device regions of the semiconductor substrate 101. A second inter-layer insulator 105 is formed on the first inter-layer insulator 104. A first level interconnection layer 106 extends through the second inter-layer insulator 105. A silicon nitride layer 107 is provided on the second inter-layer insulator 105. Contact holes are provided which penetrate the silicon nitride layer 107, the second inter-layer insulator 105 and the first inter-layer insulator 104 to reach the surface of the semiconductor substrate 101. First conductive films 111 are provided within the contact holes 110, wherein the bottoms of the first conductive films 111 are in contact with the surface of the semiconductor substrate 101. Second conductive films 115 are formed on the silicon nitride layer 107, so that the second conductive films 115 are in contact with the tops of the first conductive films 111 within the contact holes 110. A pair of the first conductive film 111 and the second conductive film 115 forms a bottom electrode 117. A capacitive insulation film 118 is provided which extends on the second conductive film 115. A top electrode 119 is provided which extends on the capacitive insulation film 118. The bottom electrode 117, the capacitive insulation film 118 and the top electrode 119 form a storage capacitor.

FIGS. 2A through 2L are fragmentary cross sectional elevation views illustrative of semiconductor memory devices having storage capacitors in sequential steps involved in a conventional method of forming the semiconductor memory device.

With reference to FIG. 2A, field oxide films 103 are selectively formed on a surface of a semiconductor substrate 101, so that the field oxide films 103 define active regions or device regions. Gate insulation films not illustrated are formed on the active regions or the device regions of the semiconductor substrate 101. Gate electrodes 102 are formed on the gate insulation films. A first inter-layer insulator 104 is formed which extends over the field oxide films 103 and the active regions or the device regions of the semiconductor substrate 101. A second inter-layer insulator 105 is formed on the first inter-layer insulator 104. A first level interconnection layer 106 is formed which extends through the second inter-layer insulator 105. A silicon nitride layer 107 is formed on the second inter-layer insulator 105.

A photo-resist film is entirely applied on the silicon nitride layer 107. The photo-resist film is patterned by a photo-lithography technique to form a first photo-resist pattern 108 on the silicon nitride layer 107, wherein the first photo-resist pattern 108 has openings 109 at predetermined positions. The first and second inter-layer insulators 104 and 105 may be made of phospho silicate glass or boron phospho silicate glass. The first level interconnection layer 106 may be made of tungsten silicide.

With reference to FIG. 2B, the first resist-pattern 108 is used to carry out a first anisotropic etching process such as a dry etching process to form contact holes 110 which penetrate the silicon nitride layer 107, the second inter-layer insulator 105 and the first inter-layer insulator 104 to reach the surface of the semiconductor substrate 101.

With reference to FIG. 2C, the used first resist-pattern 108 is removed.

With reference to FIG. 2D, first conductive films 111 are formed within the contact holes 110, wherein the bottoms of the first conductive films 111 are in contact with the surface of the semiconductor substrate 101. The first conductive films 111 are made of polysilicon.

With reference to FIG. 2E, a first insulation film 113 is formed on the silicon nitride layer 107 and on the tops of the first conductive films 111 within the contact holes 110. A photo-resist film is entirely applied on the first insulation film 113. The photo-resist film is patterned by a photo-lithography technique to form a second photo-resist pattern 112 on the first insulation film 113.

With reference to FIG. 2F, the second photo-resist pattern 112 is used to car out a second anisotropic etching process such as a dry etching process to selectively remove the first insulation film 113 to form mask patterns 114 on the silicon nitride layer 107.

With reference to FIG. 2G, a second conductive film 115 is formed on the silicon nitride layer 107 and on the mask patterns 114 as well as on the tops of the first conductive films 111 within the contact holes 110, so that the second conductive film 115 is in contact with the tops of the first conductive films 111 within the contact holes 110.

With reference to FIG. 2H, a second insulation film 116 is formed on the second conductive film 115.

With reference to FIG. 2I, the second insulation film 116 is subjected to an etch back until the second conductive film 115 over the mask patterns 114 are etched and the tops of the mask patterns 114 are made shown.

With reference to FIG. 2J, the mask patterns 114 and the second insulation films 116 are removed by etching process with use of the silicon nitride layer 107 as an etching stopper. As a result, a plurality of bottom electrodes 117 are formed, each of which comprises a pair of the second conductive film 115 and the first conductive films 111.

With reference to FIG. 2K, a capacitive insulation film 118 is formed which extends on the second conductive film 115 and on the silicon nitride layer 107.

With reference to FIG. 2L, a top electrode 119 is formed which extends on the capacitive insulation film 118. As a result, a plurality of storage capacitors are formed, each of which comprises the bottom electrode 117, the capacitive insulation film 118 and the top electrode 119.

The above conventional storage capacitor and the conventional method of forming the same have the following disadvantages.

The bottom electrode 117 comprises two parts, for examples, the first and second conductive films 111 and 115.

There are necessary two processes for forming the first and second conductive films 111 and 115 respectively in order to form the bottom electrode 117 of the storage capacitor.

Further, a boundary between the first and second conductive films 111 and 115 is likely to be broken in cleaning process and pre-treatment process. Particularly, in the staked capacitor, a connecting area between the first and second conductive films 111 and 115 is very small and the connecting portion between the first and second conductive films 111 and 115 is likely to be broken. It was required how to prevent or avoid the connecting portion from being broken.

In the above circumstances, it had been required to develop a novel storage capacitor and a novel method of forming the same free from the above problem.

SUMMARY OF THE INVENTION

Accordingly, it is an object of the present invention to provide a novel storage capacitor free from the above problems.

It is a further object of the present invention to provide a novel method of forming a storage capacitor free from the above problems.

The present invention provides a method of forming at least a bottom electrode of a capacitor in a semiconductor device. The method comprises the steps: forming a first insulation turn on a multilayer structure over a semiconductor substrate; forming at least a contact hole which penetrates through the first insulation film and the multilayer structure to reach a surface of the semiconductor substrate; selectively removing the first insulation film to form mask patterns on the multilayer structure; forming a single conductive film which extends within the at least contact hole and over the multilayer structure as well as cover the mask patterns; forming a second insulation film on the single conductive film; partially removing the second insulation film and the single conductive film over the mask patterns so that tops of the mask patterns are shown; and removing remaining parts of the second insulation film and the mask patterns to form at least a bottom electrode comprising a single conductive layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
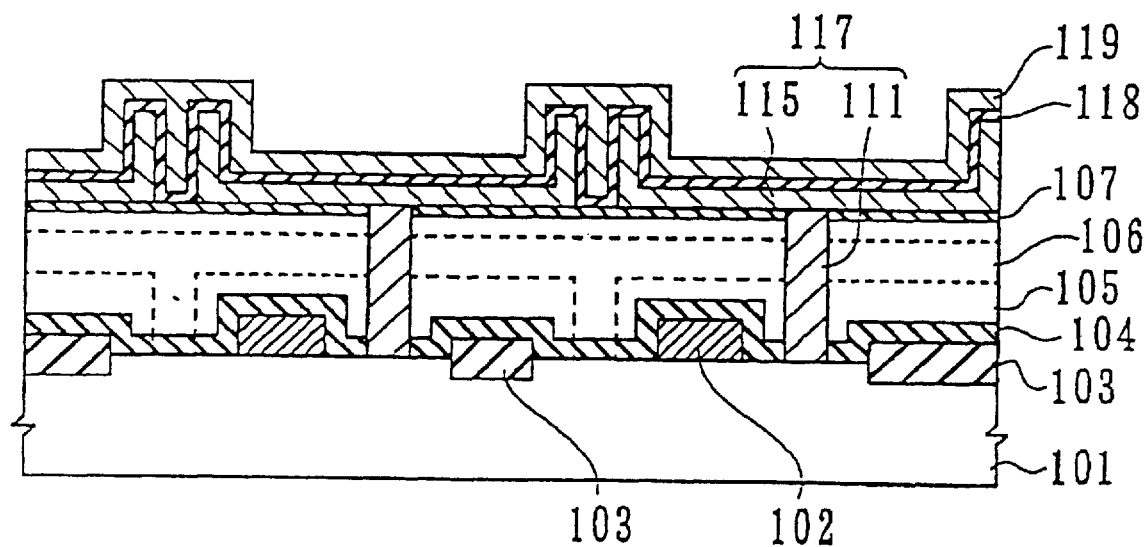
FIG. 1 is a fragmentary cross sectional elevation view illustrative of a conventional storage capacitor provided in a semiconductor memory device.
Figure 2A:
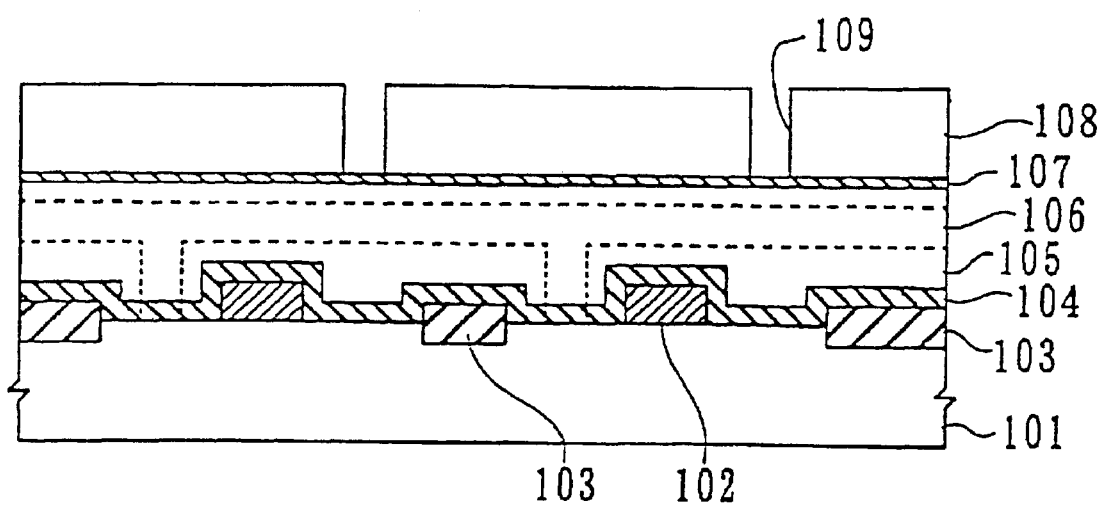
FIGS. 2A through 2L are fragmentary cross sectional elevation views illustrative of semiconductor memory devices having storage capacitors in sequential steps involved in a conventional method of forming the semiconductor memory device.
Figure 2B:
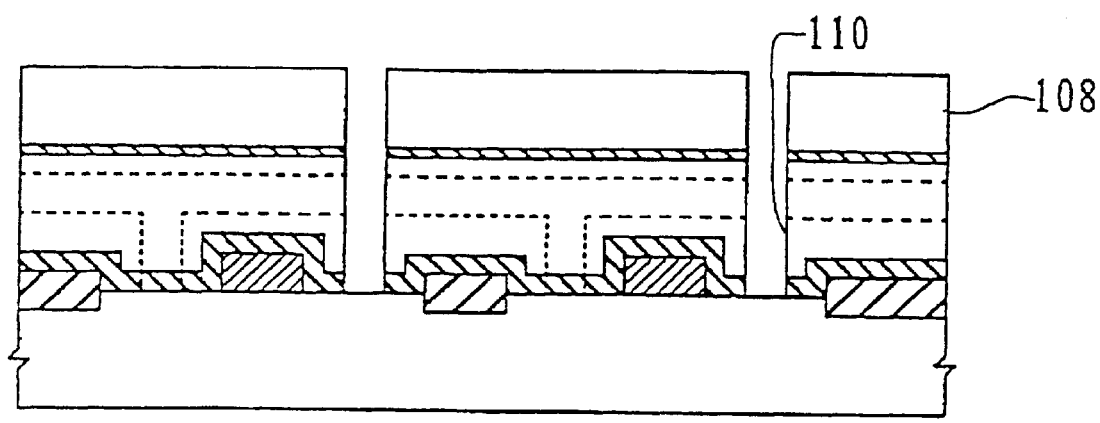
Figure 2C:
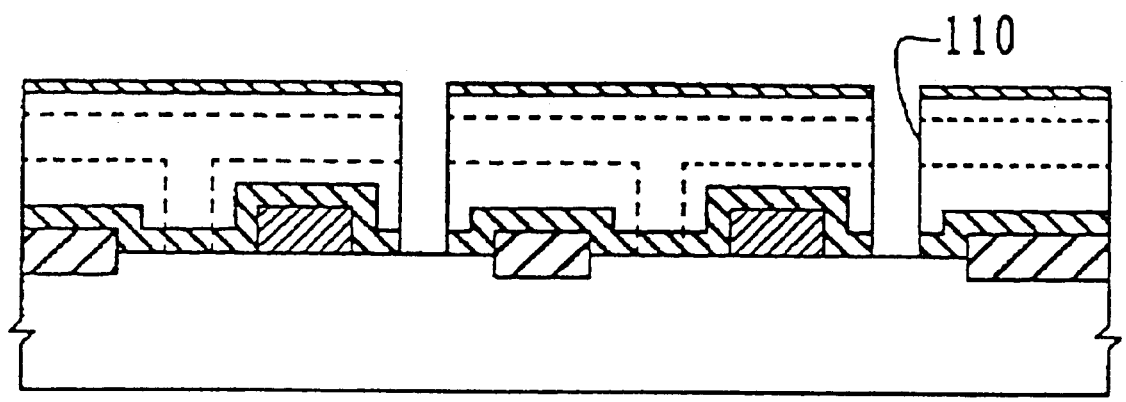
Figure 2D:
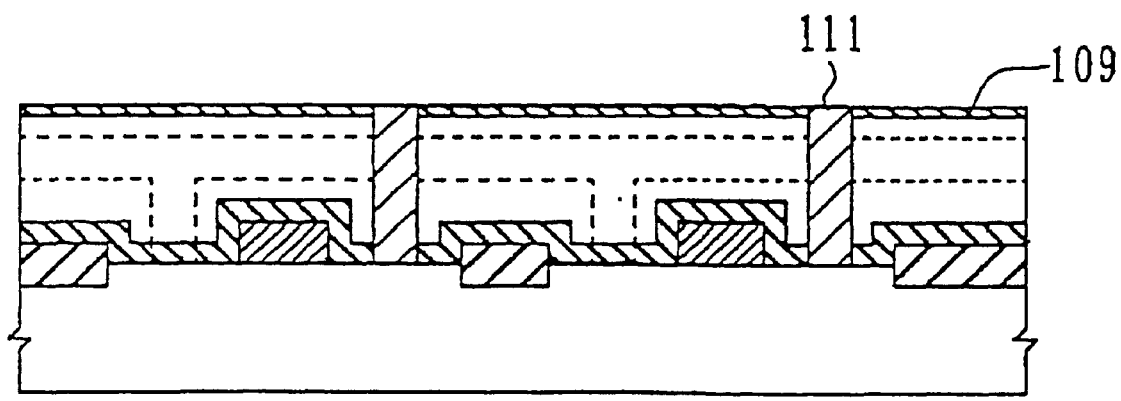
Figure 2E:
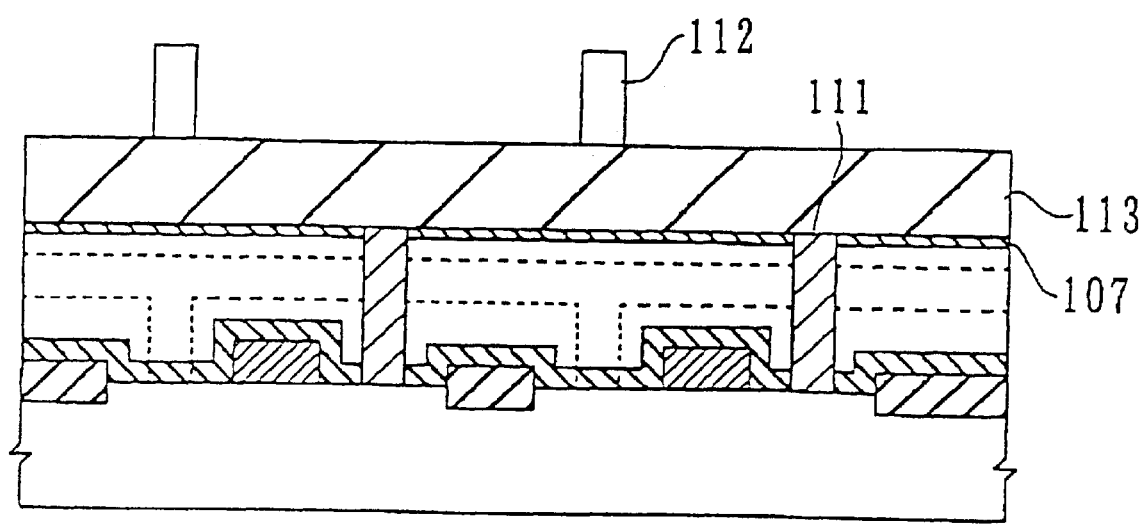
Figure 2F:
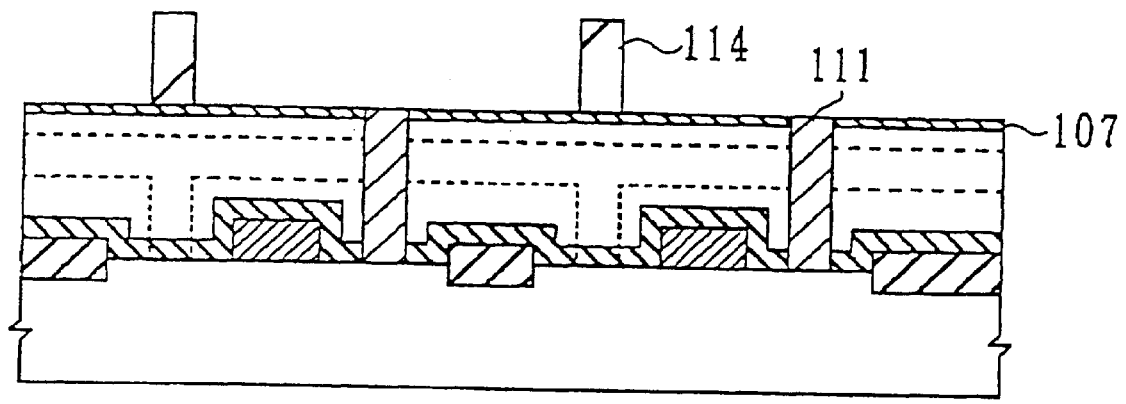
Figure 2G:
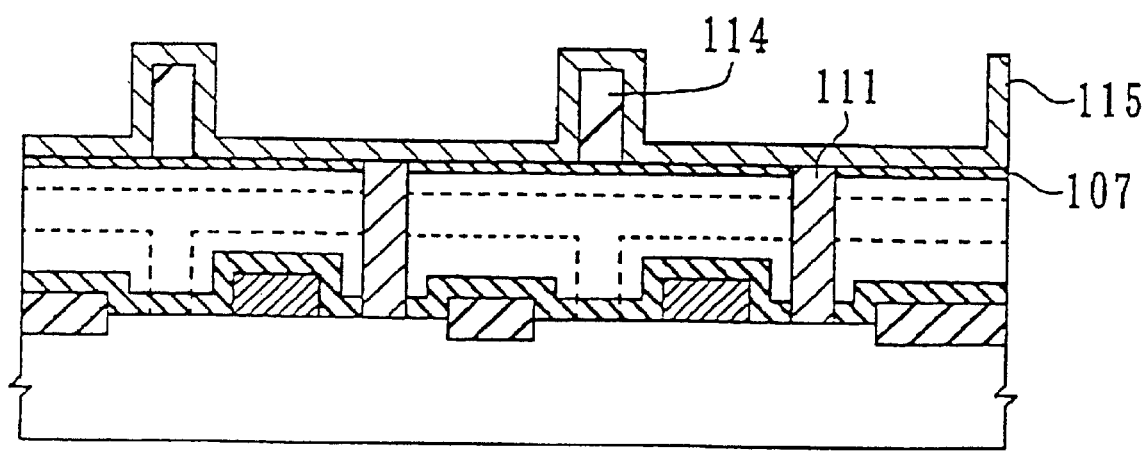
Figure 2H:
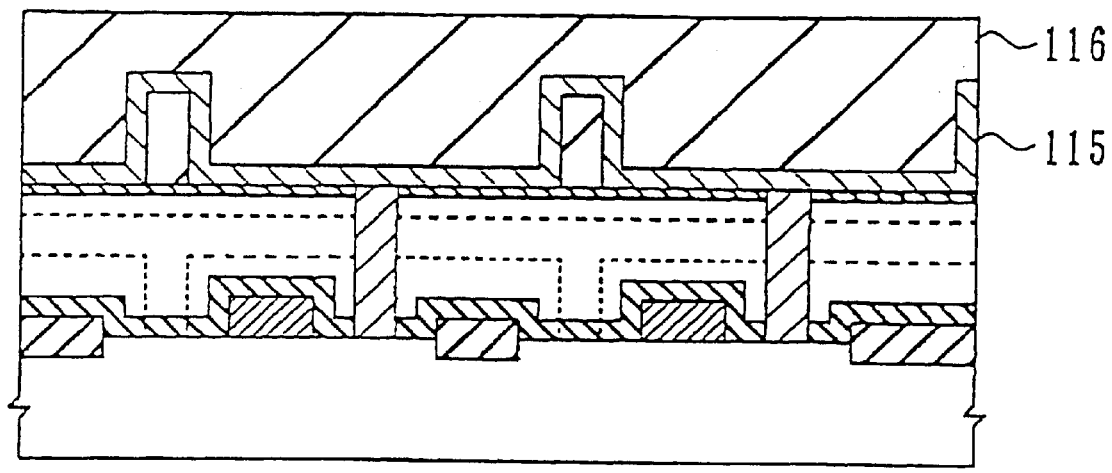
Figure 2I:
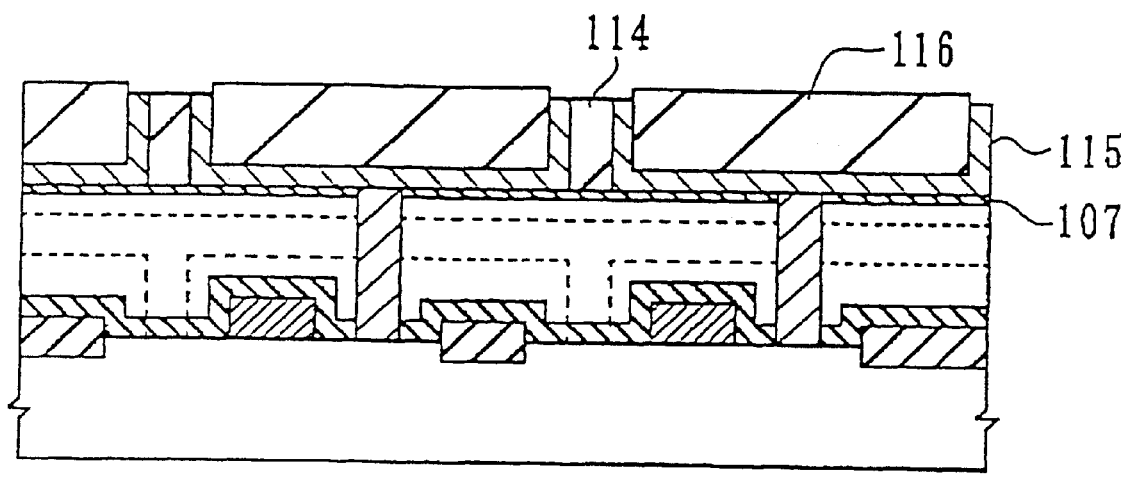
Figure 2J:
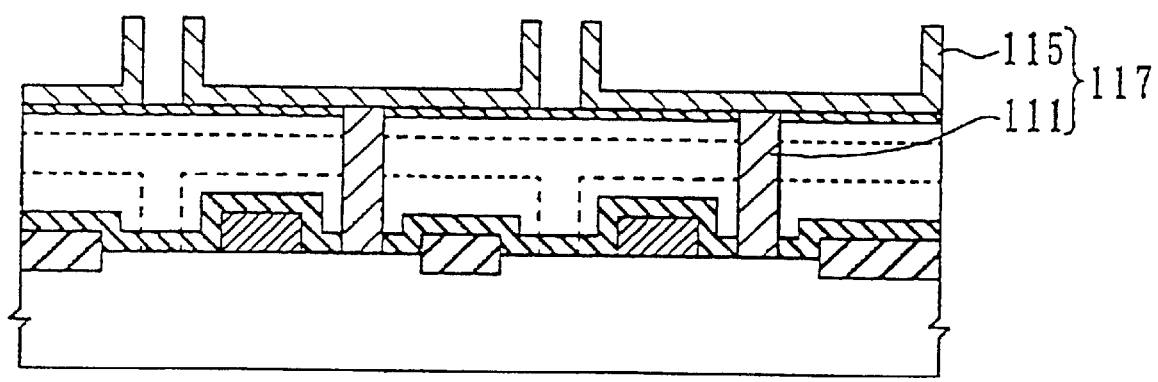
Figure 2K:
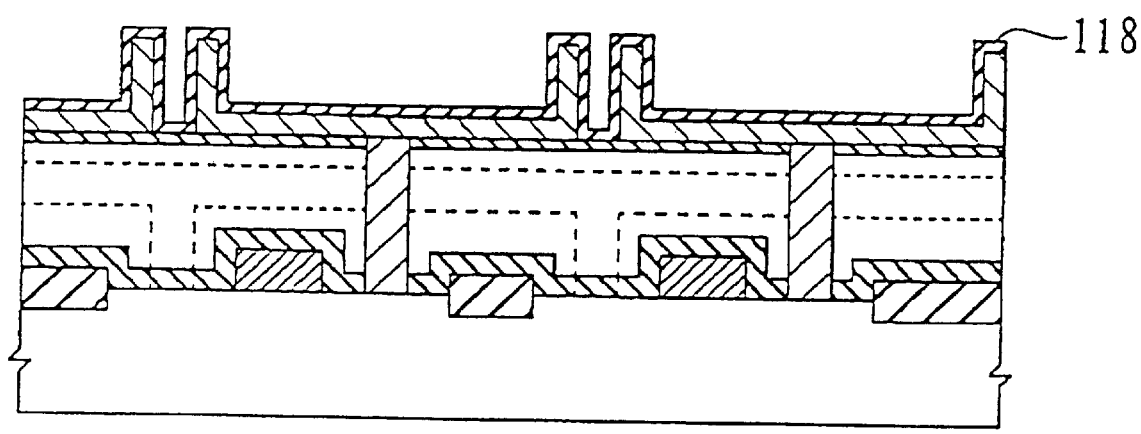
Figure 2L:
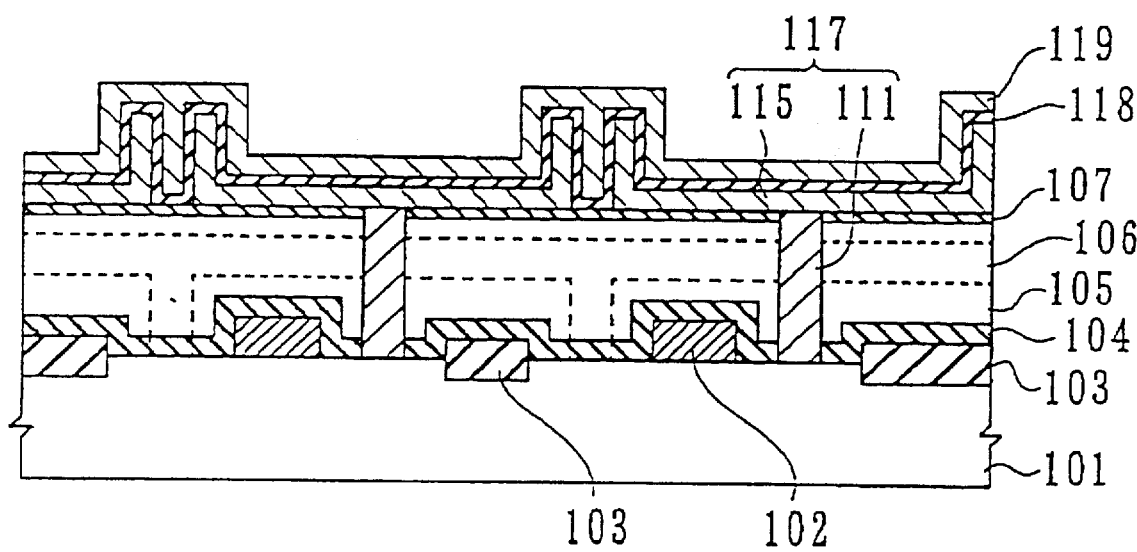

The present invention provides a method of forming at least a bottom electrode of a capacitor in a semiconductor device. The method comprises the steps: forming a first insulation film on a multilayer structure over a semiconductor substrate; forming at least a contact hole which penetrates through the first insulation film and the multilayer structure to reach a surface of the semiconductor substrate; selectively removing the first insulation film to form mask patterns on the multilayer structure; forming a single conductive film which extends within the at least contact hole and over the multilayer structure as well as cover the mask patterns; forming a second insulation film on the single conductive film; partially removing the second insulation film and the single conductive film over the mask patterns so that tops of the mask patterns are shown; and removing remaining parts of the second insulation film and the mask patterns to form at least a bottom electrode comprising a single conductive layer.

It is possible that the step of partially removing the second insulation film and the single conductive film comprises an etch back process.

It is also possible that the step of partially removing the second insulation film and the single conductive film comprises a chemical mechanical polishing.

It is also possible that the step of selectively removing the first insulation film comprises a lithography process.

The second present invention provides a method of forming a storage capacitor in a semiconductor device. The method comprises the steps: forming a first insulation film on a multilayer structure over a semiconductor substrate; forming at least a contact hole which penetrates through the first insulation film and the multilayer structure to reach a surface of the semiconductor substrate; selectively removing the first insulation film to form mask patterns on the multilayer structure; forming a single conductive film which extends within the at least contact hole and over the multilayer structure as well as cover the mask patterns; forming a second insulation film on the single conductive film; partially removing the second insulation film and the single conductive film over the mask patterns so that tops of the mask patterns are shown; removing remaining parts of the second insulation film and the mask patterns to form at least a bottom electrode comprising a single conductive layer; forming a capacitive insulation film on the bottom electrode; and forming a top electrode on the capacitive insulation film.

It is possible that the step of partially removing the second insulation film and the single conductive film comprises an etch back process.

It is possible that the step of partially removing the second insulation film and the single conductive film comprises a chemical mechanical polishing.

It is possible that the step of selectively removing the fist insulation film comprises a lithography process.

The bottom electrode comprises a single part, for examples, the single conductive layer which extends within the contact holes and over the multilayer structure. There is necessary a single process for forming the single conductive film in order to form the bottom electrode of the storage capacitor, The number of the necessary steps for forming the storage capacitor in accordance with the above described invention is smaller than the number of the necessary steps for forming the storage capacitor in the conventional method.

Further, no boundary exists between the vertically extending parts within the contact holes and the horizontally extending parts over the multi-layer structure. The bottom electrode comprising the single conductive film or the single part is free from any possibility of breaking in cleaning process and pre-treatment process. Particularly, even the bottom electrode has a very small area between vertically extending parts within the contact holes and the horizontally extending parts over the multi-layer structure. There is no possibility of breaking the connecting portion between the vertically extending parts within the contact holes and the horizontally extending parts over the multi-layer structure. Namely, the bottom electrode comprising the single conductive film or the single part is free from any possibility of breaking the connecting portion between the vertically extending parts within the contact holes and the horizontally extending parts over the multi-layer structure.

PREFERRED EMBODIMENT

A first embodiment according to the present invention will be described in detail with reference to the drawings.

Figure 3:
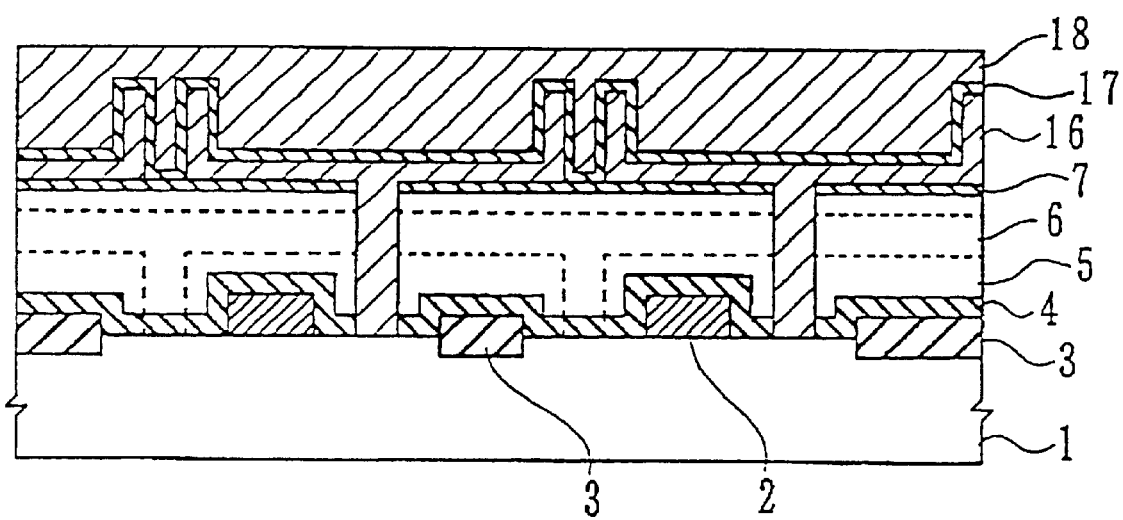
FIG. 3 is a fragmentary cross sectional elevation view illustrative of a novel storage capacitor provided in a semiconductor memory device in a preferred embodiment in accordance with the present invention.

FIG. 3 is a fragmentary cross sectional elevation view illustrative of a novel storage capacitor provided in a semiconductor memory device in a preferred embodiment in accordance with the present invention. The semiconductor memory device is formed on a semiconductor substrate 1 such as a silicon substrate. Field oxide films 3 are selectively formed on a surface of the semiconductor substrate 1, so that the field oxide films 3 define active regions or device regions. Gate insulation films not illustrated are provided on the active regions or the device regions of the semiconductor substrate 1. Gate electrodes 2 are formed on the gate insulation films. A first inter-layer insulator 4 is provided which extends over the field oxide films 3 and the active regions or the device regions of the semiconductor substrate 1. A second inter-layer insulator 5 is formed on the first inter-layer insulator 4. A first level interconnection layer 6 extends through the second inter-layer insulator 5. A silicon nitride layer 7 is provided on the second inter-layer insulator 5. Contact holes are provided which penetrate the silicon nitride layer 7, the second inter-layer insulator 5 and the first inter-layer insulator 4 to reach the surface of the semiconductor substrate 1. A plurality of bottom electrodes 16 is provided which extends within the contact holes and over the silicon nitride layer 7, wherein the bottoms of the bottom electrodes 16 are in contact with the surface of the semiconductor substrate 1. A capacitive insulation film 17 is provided which extends on the bottom electrodes 16. A top electrode 18 is provided which extends on the capacitive insulation film 17. The bottom electrode 117, the capacitive insulation film 17 and the top electrode 18 form a storage capacitor.

FIGS. 4A through 4I are fragmentary cross sectional elevation views illustrative of semiconductor memory devices having storage capacitors in sequential steps involved in a novel method of forming the semiconductor memory device in a preferred embodiment in accordance with the present invention.

Figure 4A:
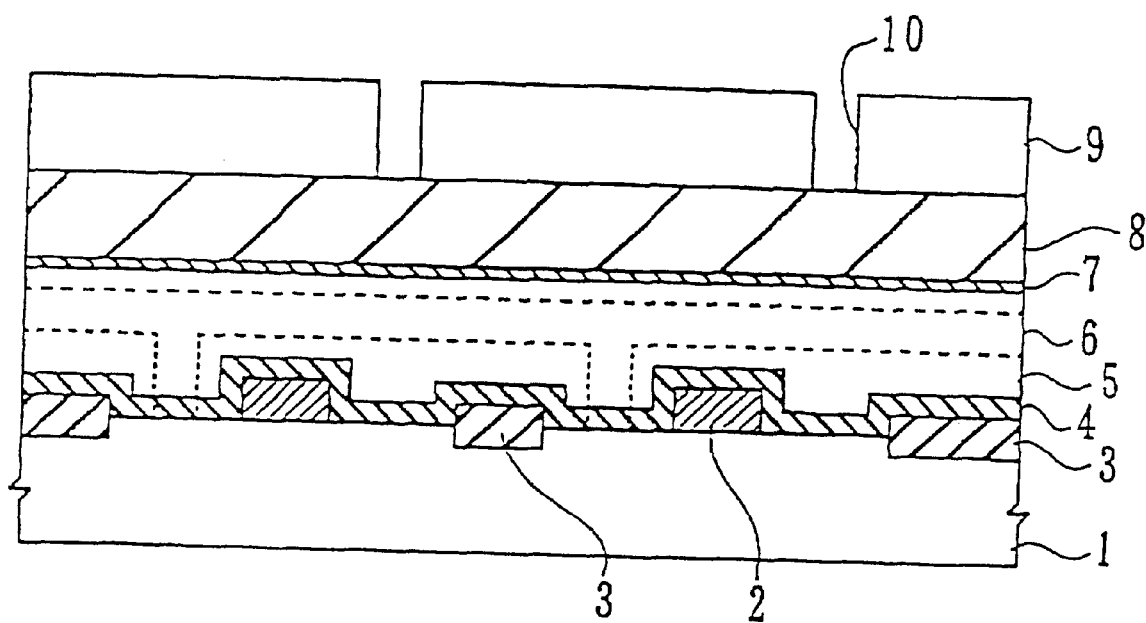
FIGS. 4A through 4I are fragmentary cross sectional elevation views illustrative of semiconductor memory devices having storage capacitors in sequential steps involved in a novel method of forming the semiconductor memory device in a preferred embodiment in accordance with the present invention.

With reference to FIG. 4A, field oxide films 3 are selectively formed on a surface of a semiconductor substrate 1, so that the field oxide films 3 define active regions or device regions. Gate insulation films not illustrated are formed on the active regions or the device regions of the semiconductor substrate 1. Gate electrodes 2 are formed on the gate insulation films. A first inter-layer insulator 4 is formed which extends over the field oxide films 3 and the active regions or the device regions of the semiconductor substrate 1. A second inter-layer insulator 5 is formed on the first inter-layer insulator 4. A first level interconnection layer 6 is formed which extends through the second inter-layer insulator 5. A silicon nitride layer 7 is formed on the second inter-layer insulator 5. A first insulation film 8 is further formed on the silicon nitride layer 7.

A photo-resist film is entirely applied on the fist insulation film 8. The photo-resist film is patterned by a photo-lithography technique to form a first photo-resist pattern 9 on the first insulation film 8, wherein the first photo-resist pattern 9 has openings 10 at predetermined positions. The first and second inter-layer insulators 4 and 5 and the first insulation film 8 may be made of phospho silicate glass or boron phospho silicate glass. The first level interconnection layer 6 may be made of tungsten silicide.

Figure 4B:
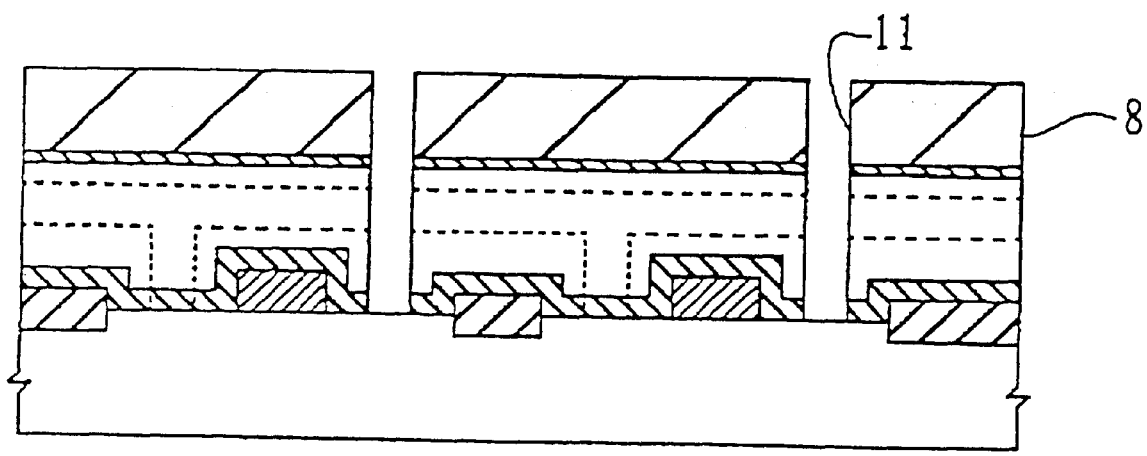

With reference to FIG. 4B, the first resist-pattern 9 is used to carry out a first anisotropic etching process such as a dry etching process to form contact holes 11 which penetrate the first insulation film 8, the silicon nitride layer 7, the second inter-layer insulator 5 and the first inter-layer insulator 4 to reach the surface of the semiconductor substrate 1. The used first resist-pattern 108 is removed.

Figure 4C:
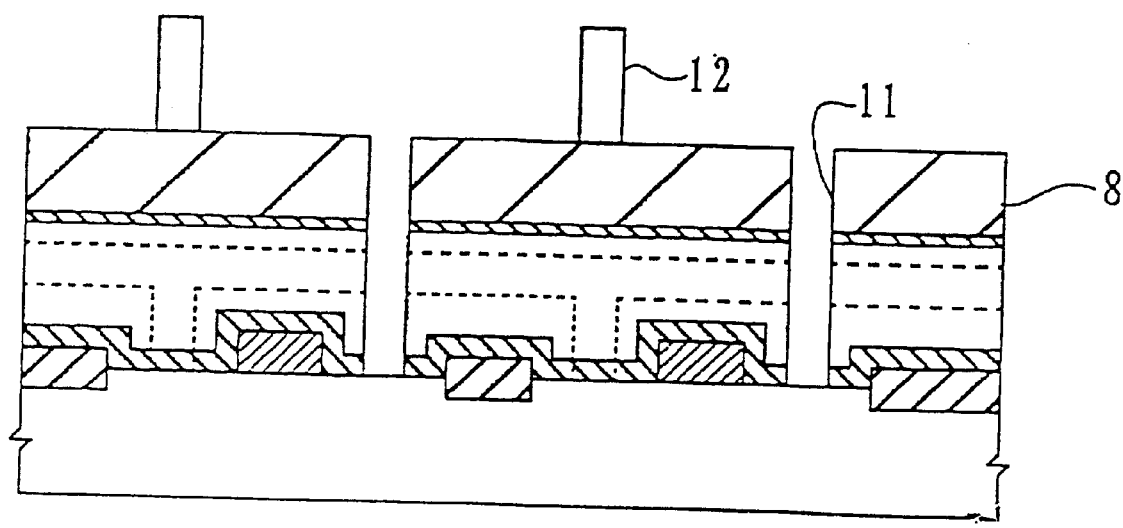

With reference to FIG. 4C, a photo-resist film is entirely applied on the first insulation film 8. The photo-resist film is patterned by a photo-lithography technique to form a second photo-resist pattern 12 on the first insulation film 8.

Figure 4D:
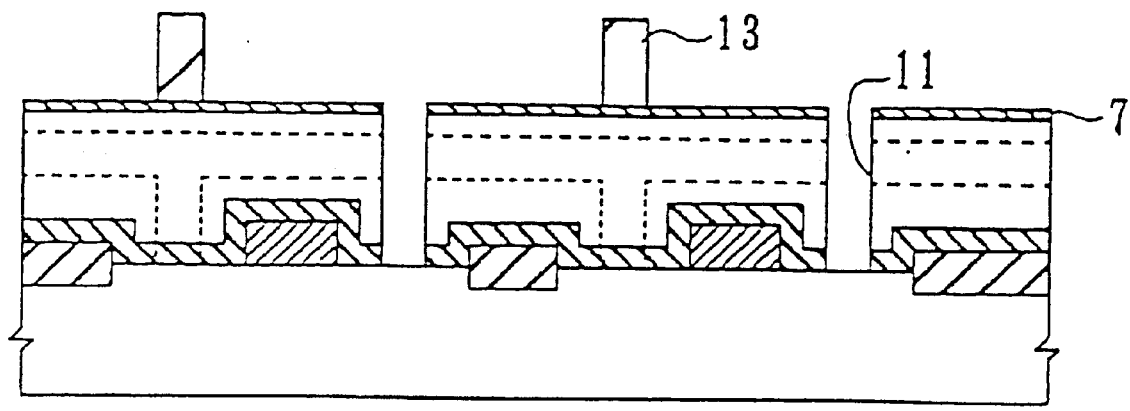

With reference to FIG. 4D, the second photo-resist pattern 12 is used as a mask to carry out a second anisotropic etching process such as a dry etching process to selectively remove the first insulation film 8 to form mask patterns 13 on the silicon nitride layer 7.

Figure 4E:
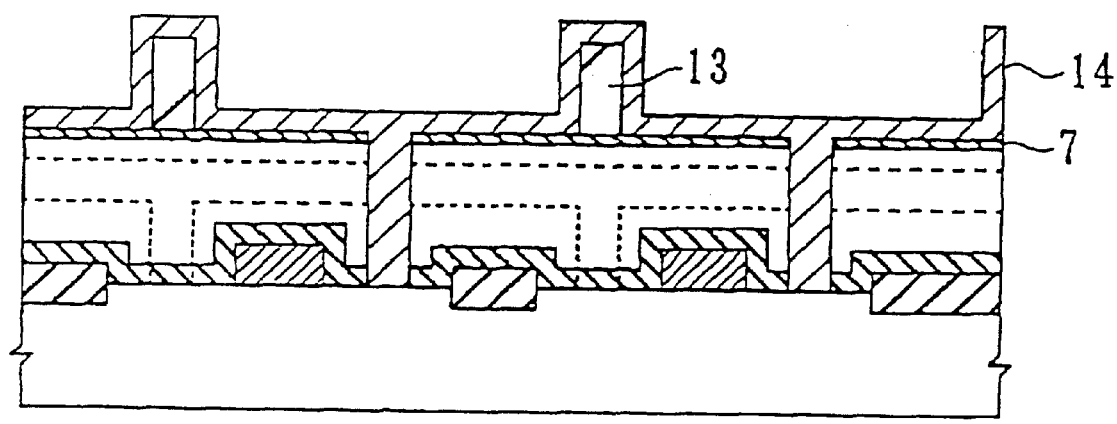

With reference to FIG. 4E, a conductive film 14 is formed on the silicon nitride layer 7 and on the mask patterns 114 as well as within the contact holes 11, so that the bottoms of the conductive film 14 within the contact holes 11 are in contact with the surface of the semiconductor substrate 1. The conductive film 14 is made of polysilicon.

Figure 4F:
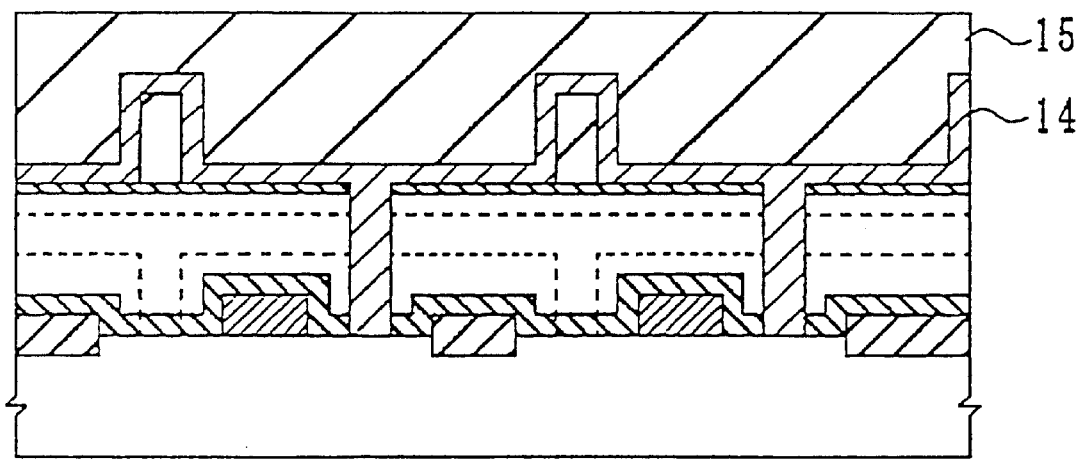

With reference to FIG. 4F, a second insulation film 15 is formed on the conductive film 14.

Figure 4G:
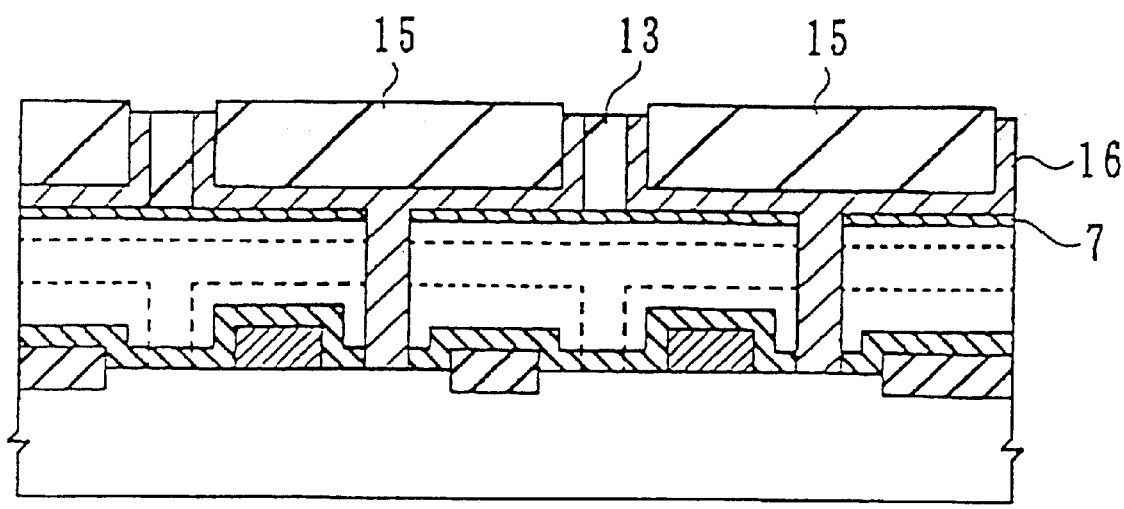

With reference to FIG. 4G, the second insulation film 15 is subjected to an etch back until the conductive film 14 over the mask patterns 13 are etched and the tops of the mask patterns 13 are made shown.

Figure 4H:
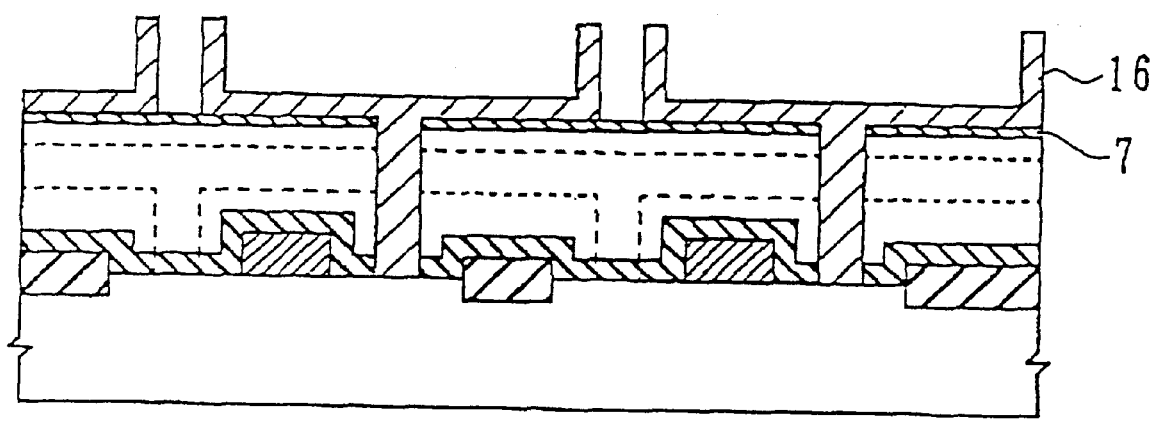

With reference to FIG. 4H, the mask patterns 13 and the second insulation films 15 are removed by etching process with use of the silicon nitride layer 7 as an etching stopper. As a result, a plurality of bottom electrodes 16 are formed, each of which comprises a single conductive film.

Figure 4I:
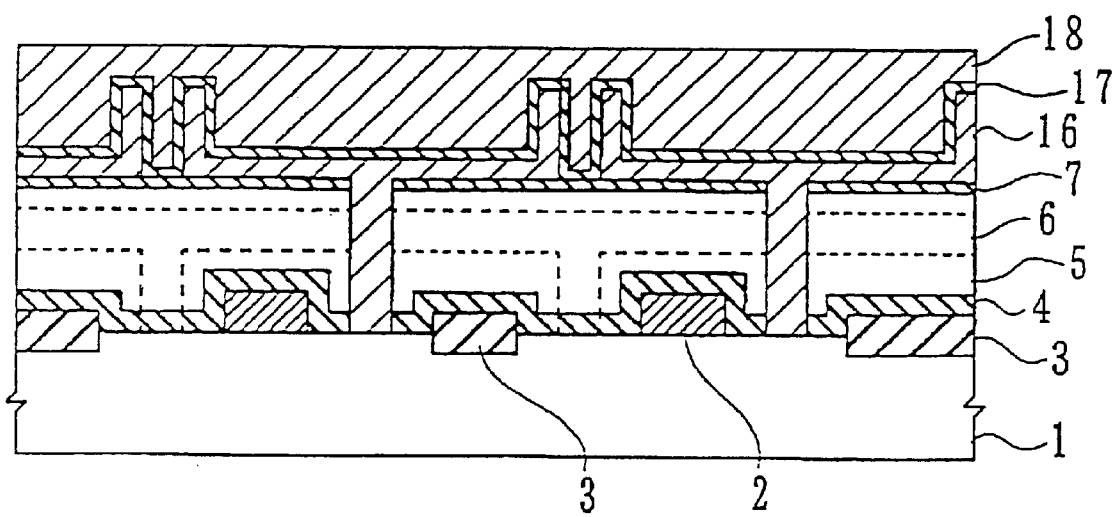

With reference to FIG. 4I, a capacitive insulation film 17 is formed which extends on the bottom electrode 16 and on the silicon nitride layer 7. A top electrode 18 is formed which extends on the capacitive insulation film 17. As a result, a plurality of storage capacitors are formed, each of which comprises the bottom electrode 16, the capacitive insulation film 17 and the top electrode 18.

The above etch-back process may be replaced by a chemical mechanical polishing. The capacitive insulation film 17 may be made of $Ta_2O_5$ or $BaSrTiO_3$. The top electrode 18 may be made of polysilicon.

The above novel storage capacitor and the novel method of forming the same have the following advantages.

The bottom electrode 16 comprises a single part, for examples, the single conductive layer which extends within the contact holes 11 and over the silicon nitride layer 7. There is necessary a single process for forming the single conductive film in order to form the bottom electrode 16 of the storage capacitor. The number of the necessary steps for forming the storage capacitor in accordance with the above described invention is smaller than the number of the necessary steps for forming the storage capacitor in the conventional method.

Further, no boundary exists between the vertically extending parts within the contact holes and the horizontally extending parts over the silicon nitride layer 7. The bottom electrode 16 comprising the single conductive film or the single part is free from any possibility of breaking in cleaning process and pre-treatment process. Particularly, even the bottom electrode 16 has a very small area between vertically extending parts within the contact holes and the horizontally extending parts over the silicon nitride layer 7. There is no possibility of breaking the connecting portion between the vertically extending parts within the contact holes and the horizontally extending parts over the silicon nitride layer 7. Namely, the bottom electrode 16 comprising the single conductive film or the single part is free from any possibility of breaking the connecting portion between the vertically extending parts within the contact holes and the horizontally extending parts over the silicon nitride layer 7.

The substrate, the insulation films, the interconnection layer, the gate electrode, the field oxide films, the bottom electrodes, the capacitive insulation film, and the top electrode should not be limited in shape and material into the above.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming at least a bottom electrode of a capacitor in a semiconductor device, said method comprising the steps:

forming a first insulation film on a multilayer structure over a semiconductor substrate;

forming at least a contact hole which penetrates through said first insulation film and said multilayer structure to reach a surface of the semiconductor substrate;

selectively removing said first insulation film to form mask patterns on said multilayer structure;

forming a single conductive film which extends within said at least one contact hole and over said multilayer structure as well as cover said mask patterns, said single conductive film entirely filling each said contact hole;

forming a second insulation film on said single conductive film;

partially removing said second insulation film and said single conductive film over said mask patterns so that tops of said mark patterns are shown; and removing remaining parts of said second insulation film and said mask patterns to form at least a bottom electrode comprising a single conductive layer.

2. The method as claimed in claim 1, wherein said step of partially removing said second insulation film and said single conductive film comprises an etch back process.

3. The method as claimed in claim 1, wherein said step of partially removing said second insulation film and said single conductive film comprises a chemical mechanical polishing.

4. The method as claimed in claim 1, wherein said step of selectively removing said first insulation film comprises a lithography process.

5. A method of forming a storage capacitor in a semiconductor device, said method comprising the steps:

forming a first insulation film on a multilayer structure over a semiconductor substrate;

forming at least a contact hole which penetrates through said first insulation film and said multilayer structure to reach a surface of the semiconductor substrate;

selectively removing said first insulation film to form mask patterns on said multilayer structure;

forming a single conductive film which extends within said at least one contact hole and over said multilayer structure as well as cover said mask patterns, said single conductive film entirely filling each said contact hole;

forming a second insulation film on said single conductive film;

partially removing said second insulation film and said single conductive film over said mask patterns so that tops of said mask patterns are shown;

removing remaining parts of said second insulation film and said mask patterns to form at least a bottom electrode comprising a single conductive layer;

forming a capacitive insulation film on said bottom electrode; and forming a top electrode on said capacitive insulation film.

6. The method as claimed in claim 5, wherein said step of partially removing said second insulation film and said single conductive film comprises an etch back process.

7. The method as claimed in claim 5, wherein said step of partially removing said second insulation film and said single conductive film comprises a chemical mechanical polishing.

8. The method as claimed in claim 5, wherein said step of selectively removing said first insulation film comprises a lithography process.

* * * * *